United States Patent [19]

Hochberg et al.

[11] Patent Number: 4,981,724

[45] Date of Patent: Jan. 1, 1991

[54] DEPOSITION OF SILICON OXIDE FILMS USING ALKYLSILANE LIQUID SOURCES

[76] Inventors: Arthur K. Hochberg, 1037 Santa Queta, Solana Beach, Calif. 92075; David L. O'Meara, 632 S. Freeman, Oceanside, Calif. 92054

[21] Appl. No.: 263,487

[22] Filed: Oct. 27, 1988

[51] Int. Cl.$^5$ .................... C23C 16/40; C23C 16/46
[52] U.S. Cl. .................... 427/255.3; 427/255.1; 427/255.2
[58] Field of Search ................ 427/255.1, 255.2, 255.3

[56] References Cited

PUBLICATIONS

Avigal et al., *J. Elec. Soc.*, vol. 121, No. 8, pp. 1103–1107.
Bunshah et al., *Deposition Technologies for Films & Coatings*, (Noyes, Park Ridge, N.J.), c. 1983, pp. 351–356.
Vossen et al., *Thin Film Processes*, (Academic Press, N.Y.), c. 1978, pp. 274–275.

*Primary Examiner*—Norman Morgenstern
*Assistant Examiner*—Margaret Beuker
*Attorney, Agent, or Firm*—James C. Simmons; William F. Marsh

[57] ABSTRACT

A chemical vapor deposition process for depositing silicon dioxide comprising the steps of heating a substrate upon which deposition is desired to a temperature of from about 325° C. to about 700° C. in a vacuum having a pressure of from about 0.1 to about 1.5 torr, and introducing a silane selected from the group consisting of alkylsilane, arylsilane and araylkylsilane wherein the alkyl-, aryl- or aralkyl- moiety comprises from 2–6 carbons, and oxygen or carbon dioxide into the vacuum.

10 Claims, No Drawings

DEPOSITION OF SILICON OXIDE FILMS USING ALKYLSILANE LIQUID SOURCES

FIELD OF THE INVENTION

This invention relates to the manufacture of semiconductor devices and, specifically, to the deposition of silicon oxide coatings, with particular application in the manufacture of semiconductor devices, but not limited thereto.

BACKGROUND OF THE INVENTION

It is standard practice in the manufacture of many semiconductor devices, and other devices, to provide a thin passive layer or coating of a chemically nonreactive or low reactivity material to protect the semiconductor junctions and layers from degradation by contact with oxygen, fumes in the air, moisture, etc., and from damage by contact during packaging and handling and to stabilize the electrical characteristics of the device.

The production of silicon oxide coatings application to semiconductor devices and to other devices is well known, and there is considerable literature on the subject. The general principles underlying the formation of thin films are described in HANDBOOK OF THIN FILM TECHNOLOGY, Maissell, Leon I. and Glang, Reinhard, editors, McGraw Hill Book Company, New York, 1970, and the general technology for processing silicon-based semiconductor devices in described in SILICON PROCESSING FOR THE VLSI ERA, Wolf, Stanley, and Talbert, Richard N., editors, Lattice Press, Sunset Beach, Calif., 1986, which includes a discussion of thin film technology.

The present invention relates to the manufacture of devices in which thin films of silicon oxides, $SiO_2$ principally, are deposited on substrates. Economically, the greatest industrial application of this invention is in the manufacture of semiconductor devices; however, the discoveries of this invention are applicable to any thin film deposition of $SiO_2$ on substrates which are capable of being heated to temperatures in the range of from about 300° C. to about 600° C.

The chemistry of silanes is described by Arkles, B., Peterson, W. R., Jr., KIRK-OTHMER ENCYCLOPEDIA OF CHEMICAL TECHNOLOGY, 3rd ed. Vol 20, 887-911. Silanes, also referred to as silicon hydrides, are compounds containing a hydrogen-silicon bond. Compounds which include only silicon-carbon bonds, i.e. where all hydrogens have been replaced by alkyl, aryl or aralkyl substituents are also referred to occasionally, and herein, as silanes.

The properties of organosilanes are determined largely by the properties of the silicon atom which is larger than the carbon atom, enabling nucleophilic attack on the silicon to occur more readily than on carbon. Electrophilic attack on hydrogen bonded to silicon is also facilitated by the small steric constraints of hydrogen and the increased bond length for Si—H. In addition to the increased bond length, the Si—H bond energy is considerably lower than C—H and is reflected in the thermal stabilities of such bonds. Organohydrosilanes begin to decompose at 440°-460° C. through homolytic cleavage of the Si—H bond and subsequent radical formation.

Organohydrosilanes undergo a wide variety of chemical conversions. The Si—H bond of organohydrosilanes reacts with elements of most groups of the periodic system. Organosilanes, the simplest of which is methylsilane, are stable to air. The larger-chain alkylsilanes are more stable but ignite spontaneously when vaporized in oxygen under pressure. Phenyl and cyclohexylsilane can be distilled open to the atmosphere. Trialkyl- and triarylsilanes are more stable and have been distilled at as much as 325° C. without decomposition.

Alkylation and arylation of organosilanes occur readily with alkyl and aryl alkalimetal compounds with good yields, especially in tetrahydrofuran and ethyl ether according to the general reaction:

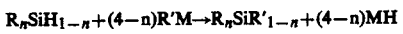

$$R_nSiH_{1-n} + (4-n)R'M \rightarrow R_nSiR'_{1-n} + (4-n)MH$$

where R and R' are alkyl, aryl or aralkyl and M is Li, Na, or K and n=1 to 4.

The preparation of organosilanes by the direct process was first reported in 1945. By this method, $CH_3SiH(Cl)_2$, $(CH_3)_2SiH(Cl)_2$, and $C_2H_5SiH(Cl)_2$ are prepared and utilized as polymers and reactive intermediates. The synthesis involves the reaction of alkyl halides, e.g., methyl and ethyl chloride, with silicon metal or silicon alloys in a fluidized bed at 250°-600° C. Dialkylamino-substituted silanes have also been obtained by a similar process and similar products are formed by cleavage of disilanes by dialkylamines, e.g. diethylamine cleavage yielding $[(C_2H_5)_2N]_2SiH(Cl)$. Organosilanes can be synthesized most conveniently in pilot, bench, and lab scale by reduction of organic-substituted halo- and alkoxysilanes with metal hydrides. The versatility of lithium aluminum hydride permits synthesis of alkyl, alkenyl, and arylsilanes—silanes containing functional groups, such as chloro, amino, and alkoxyl in the organic substituents, can also be prepared. Organosilanes are also produced by reaction of organohalosilanes and organoalkoxysilanes with organometallic compounds. Organolithium reagents, e.g., t-butyllithium, have also produced organohydrosilanes on reaction with organo-chlorosilanes and tetrahalosilanes. Disproportionation reactions have also been used to prepare organosilanes. These reactions involve interaction of organosilanes with other silicon compounds containing organic, alkoxy, and halogen groups bound to silicon. Reactions are catalyzed by a variety of materials including alkali metals, alkali metal alcoholates, and Lewis acids, e.g., aluminum, zinc, iron, and boron halides. Organochlorosilanes containing Si—H disproportionate in the presence of aluminum chloride without addition of more organosilane. A wide variety of organosilanes are most commonly prepared through reaction of inorganic and organo-chlorosilanes with Grignard reagents. Organosilanes containing mixed organic groups can be prepared by reaction of organodihalosilanes and diorganohalosilanes or alkoxy derivatives with alkyl or aryl Grignards. Organohydrosilanes can also be prepared by addition of halosilanes and organosilanes containing multiple Si—H bonds to olefins. These reactions are catalyzed by platinum, platinum salts, peroxides, ultraviolet light, or ionizing radiation.

The low pressure chemical vapor deposition (LPCVD) process which will be discussed herein and which is of principle interest in this invention involves the deposition of films from gaseous reagents in the pressure range of from about 100 mtorr to about 1000 mtorr in most instances, with operation being possible up to about 2000 mtorr in some particular examples, the latter pressure being intermediate APCVD and LPCVD operation.

A large variety of "thin films" are used in the fabrication of Very Large Scale Integration (VLSI) devices. These films may be thermally grown or deposited from the vapor phase. They can be metals, semiconductors, or insulators.

Thin films for use in VLSI fabrication must satisfy a large set of rigorous chemical, structural, and electrical requirements. Film composition and thickness must be strictly controlled to facilitate etching of submicron features. Very low densities of both particulate defects and film imperfections, such as pinholes, become critical for the small linewidths, high densities, and large areas necessary for VLSI. These small geometries also create highly rugged topography for overlying films to cover. Therefore, excellent adhesion, low stress, and conformal step coverage are required of a VLSI thin film, and its own surface topography should reduce or even planarize the underlying steps if possible. Finally, non-conducting thin films must have low dielectric constants to reduce parasitic capacitances exacerbated by the scaled down film thicknesses.

Although the properties of a bulk material may be well characterized, the same material in its thin film form may have properties substantially different from those of the bulk. One reason is that thin film properties are strongly influenced by surface properties, while in bulk materials this is not the case. The thin film, by its very definition has a substantially higher surface-to-volume ratio than does a bulk material. The structure of thin films, and their method of preparation also play a vital role in determining the film properties.

The formation of such films is accomplished by a large variety of techniques, but which can conceptually be divided into two groups: (1) film growth by interaction of a vapor-deposited species with the substrate; and (2) film formation by deposition without causing changes to the substrate material. The first category includes thermal oxidation and nitridation of single crystal silicon and polysilicon and the formation of silicides by direct reaction of a deposited metal and the substrate.

The second group includes another three subclasses of deposition: (a) chemical vapor deposition, or CVD, in which solid films are formed on a substrate by the chemical reaction of vapor phase chemicals that contain the required constituents; (b) physical vapor deposition, or PVD, in which the species of the thin film are physically dislodged from a source to form a vapor which is transported across a reduced pressure region to the substrate, where it condenses to form the thin film; and (c) coating of the substrate with a liquid, which is then dried to form the solid thin film. When CVD process are used to form single-crystal thin films, the process is termed epitaxy. The formation of thin films by PVD includes the processes of sputtering and evaporation.

Thin film generally have smaller grain size than do bulk materials. Grain size is a function of the deposition conditions and annealing temperatures. Larger grains are observed for increased film thickness, with the effect increasing with increasing substrate or deposition temperature. The initial deposition temperature plays an important role in determining the final grain size. The dependence on deposition rate is due to the fact that even if clusters have high mobility, at high deposition rate they are quickly buried under subsequent layers. For very high deposition rates, the heat of condensation can raise the substrate temperature, thereby producing increased grain size from thermal effects.

The surface roughness of films occurs as a result of the randomness of the deposition process. Real films almost always show surface roughness, even though this represents a higher energy state than that of a perfectly flat film. Depositions at high temperatures tend to show less surface roughness. This is because increased surface mobility from the higher substrate temperatures can lead to filling of the peaks and valleys. On the other hand, higher temperatures can also lead to the development of crystal facets, which may continue to grow in favored direction, leading the increased surface roughness. At low temperatures the surface roughness as measured by surface area, tends to increase with increased film thickness. Oblique deposition which results in shadowing, also increases surface roughness. Epitaxial and amorphous deposits have shown measured surface area nearly equal to the geometrical area, implying the existence of very flat films. This has been confirmed by Scanning Electron Micrography (SEM) examination of these films. Surface roughness has also been observed to increase as a result of the presence of contamination on the substrate or in the vapor phase during deposition.

The density of a thin film provides information about its physical structure. Density is usually determined by weighing the film and measuring its volume. If a film is porous from the deposition process, it generally has a lower density than bulk material.

The crystallographic structure of thin films depends on the adatom mobility, and can vary from a highly disordered or amorphous-like, state, to a well-ordered state e.g. epitaxial growth on a single crystal substrate. The amorphous structures are frequently observed for the deposited dielectrics such as $SiO_2$, $SiO$, and $Si_3N_1$, while most metals result in polycrystalline structure. Silicon can be either amorphous, polycrystalline, or single crystal, depending on the deposition parameters and the substrate material.

Some polycrystalline films deposit with a fiber texture or preferred orientation. This texture can be described as having a preponderance of grains with the same orientation in a direction normal to the substrate. Deposition of polycrystalline Si on $SiO_2$ can occur in this manner. The observed fiber texture in that case has been reported as for poly-Si deposited at 600°–650° C.

Nearly all films are found to be in a state of internal stress, regardless of the means by which they have been produced. The stress may be compressive or tensile. Compressively stressed films would like to expand parallel to the substrate surface, and in the extreme, films in compressive stress will buckle up on the substrate. Films in tensile stress, on the other hand, would like to contract parallel to the substrate, and may crack if their elastic limits are exceeded. In general, the stresses in thin films are in the range of $10^8$–$5 \times 10^{10}$ dynes/cm$^2$. Highly stressed films are generally undesirable for VLSI applications for several reasons, including: (a) they are more likely to exhibit poor adhesion; (b) they are more susceptible to corrosion; (c) brittle films, such as inorganic dielectrics, may undergo cracking in tensile stress; and (d) the resistivity of stressed metallic films is higher than that of their annealed counterparts.

The intrinsic stress reflects the film structure in ways not yet completely understood. It has been observed that the intrinsic stress in a film depends on thickness, deposition rate, deposition temperature, ambient pressure, method of film preparation, and type of substrate used, among other parameters.

At low substrate temperatures, metal films tend to exhibit tensile stress. This decreases with increasing substrate temperature, often in a linear manner, finally going through zero or even becoming compressive. The changeover to compressive stress occurs at lower temperatures for lower melting point metals.

The effect of deposition rate on film stress is ambiguous. The film stress starts out tensile, decreases as the power increases, and finally becomes compressive with further power increase. Several models relating to the origins of intrinsic stress have been proposed. These invoke the following stress-causing mechanisms: (a) lattice mismatch between the substrate and the film; (b) rapid film growth which locks in defects; and (c) incorporation of impurities into the film.

A Chemical Vapor Deposition (CVD) process can be summarized as consisting of the following sequence of steps: (a) a given composition and flow rate of reactant gases and diluent inert gases is introduced into a reaction chamber; (b) the gas species move to the substrate; (c) the reactants are adsorbed on the substrate; (d) the adatoms undergo migration and film-forming chemical reactions, and (e) the gaseous by-products of the reaction are desorbed and removed from the reaction chamber. Energy to drive the reactions can be supplied by several methods, e.g. thermal, photons, or electrons, with thermal energy being the most commonly used.

In practice, the chemical reactions of the reactant gases leading to the formation of a solid material may take place not only on or very close to the wafer surface, a heterogeneous reaction, but also in the gas phase, a homogeneous reaction. Heterogeneous reactions are much more desirable, as such reactions occur selectively only on heated surfaces, and produce good quality films. Homogeneous reactions, on the other hand, are undersirable, as they form gas phase clusters of the depositing material, which can result in poorly adhering, low density films, or defects in the depositing film. In addition, such reactions also consume reactants and can cause decreases in deposition rates. Thus, one important characteristic of a chemical reaction for CVD application is the degree to which heterogeneous reactions are favored over gas phase reactions.

Since the aforementioned steps of a CVD process are sequential, the one which occurs at the slowest rate will determine the rate of deposition. The steps can be grouped into (1) gas-phase processes, and (2) surface processes. The gas phase phenomenon of interest is the rate at which gases impinge on the substrate. This is modeled by the rate at which gases cross the boundary layer that separates the bulk regions of flowing gas and substrate surface. Such transport processes occur by gas-phase diffusion, which is proportional to the diffusivity of the gas, D, and concentration gradient across the boundary layer. The rate of mass transport is only relatively weakly influenced by temperature.

Several surface processes can be important once the gases arrive at the hot substrate surface, but the surface reaction, in general, can be modeled by a thermally activated phenomenon which proceeds at a rate which is a function of the frequency factor, the activation energy, and the temperature. The surface reaction rate increases with increasing temperature. For a given surface reaction, the temperature may rise high enough so that the reaction rate exceeds the rate at which reactant species arrive at the surface. In such cases, the reaction cannot proceed any more rapidly than the rate at which reactant gases are supplied to the substrate by mass transport, no matter how high the temperature is increased. This situation is referred to as a mass-transport limited deposition process.

On the other hand, at lower temperatures, the surface reaction rate is reduced, and eventually the arrival rate of reactants exceeds the rate at which they are consumed by the surface reaction process. Under such conditions the deposition rate is reaction rate limited. Thus, at high temperatures, the deposition is usually mass-transport limited, while at lower temperatures it is surface-reaction rate-limited. In actual processes the temperature at which the deposition condition moves from one of these growth regimes to the other is dependent on the activation energy of the reaction, and the gas flow conditions in the reactor. Thus, it is impossible to extrapolate with any certainty or accuracy date or process conditions or results from one pressure regime or temperature regime to another.

In processes that are run under reaction rate-limited conditions, the temperature of the process is an important parameter. That is, uniform deposition rates throughout a reactor require conditions that maintain a constant reaction rate. This in turn implies that a constant temperature must also exist everywhere at all wafer surfaces. On the other hand, under such conditions the rate at which reactant species arrive at the surface is not as important, since their concentration does not limit the growth rate. Thus, it is not as critical that a reactor be designed to supply an equal flux of reactants to all locations of a wafer surface. It will be seen that in low-pressure CVD (LPCVD) reactors, wafers can be stacked vertically and at very close spacing because such systems operate in a reaction rate limited mode. The reason for this is as follows:

Under the low pressure of an LPCVD reactor $\sim 1$ torr the diffusivity of the gas species is increased by a factor of 1000 over that at atmospheric pressure, and this is only partially offset by the fact that the boundary layer, the distance across which the reactants must diffuse, increases by less than the square root of the pressure. The net effect is that there is more than an order of magnitude increase in the transport of reactants to and by-products away from the substrate surface, and the rate-limiting step is thus the surface reaction.

In deposition processes that are mass-transport limited, however, the temperature control is not nearly as critical. As mentioned earlier, the mass transport process which limits the growth rate is only weakly dependent on temperature. On the other hand, it is very important that the same concentration of reactants be present in the bulk gas regions adjacent to all locations of a wafer, as the arrival rate is directly proportional to the concentration in the bulk gas. Thus, to insure films of uniform thickness across a wafer, reactors which are operated in the mass transport limited regime must be designed so that all locations of wafer surfaces and all wafers in a run are supplied with an equal flux of reactant species. Atmospheric pressure reactors that deposit $SiO_2$ at $\sim 400°$ C. operate in the mass-transport limited regime. The most widely used APCVD reactor designs provide a uniform supply of reactants by horizontally positioning the wafers and moving them under a gas stream.

CVD systems usually contain the following components: (a) gas sources; (b) gas feed lines; (c) mass-flow controllers for metering the gases into the system; (d) a reaction chamber or reactor; (e) a method for heating the wafers onto which the film is to be deposited, and in some types of systems, for adding additional energy by other means; and (f) temperature sensors. LPCVD and PECVD systems also contain pumps for establishing the reduced pressure and exhausting the gases from the chamber.

The design and operation of CVD reactors depends on a variety of factors, and hence they can be categorized in several ways. The first distinction between reactor types is whether they are hot-wall or cold-wall reactors, and this is dependent on the method used to heat the wafers. The next criterion used to distinguish reactor types is their pressure regime of operation atmospheric pressure or reduced pressure reactors. Finally, the reduced pressure group is split into: (a) low-pressure reactors the so called low-pressure CVD, or LPCVD reactors, in which the energy input is entirely thermal; and (b) those in which energy is partially supplied by a plasma as well known as plasma-enhanced CVD, or PECVD reactors. Each of the reactor types in the two pressure regimes are further divided into sub-groups, defined by reactor configuration and method of heating.

Table 1 summarizes the characteristics and applications of the various CVD reactor designs.

TABLE I

| | Characteristics and Applications of CVD Reactors | | |
|---|---|---|---|
| Process | Advantages | Disadvantages | Applications |
| APCVD Low Temperature | Simple Reactor, Fast Deposition, Low Temperature Deposition, Low Temperature | Poor Step Coverage, Particle Contamination | Low Temperature Oxides, both doped and undoped |
| LPCVD | Excellent Purity and Uniformity, Conformal Step Coverage, Large Wafer Capacity | High Temperature Low Deposition Rate | High Temperature Oxides, both doped and undoped, Silicon Nitride, Poly-Si, W, $WSI_2$ |
| PECVD | Low Temperature, Fast Deposition, Good Step Coverage | Chemical, e.g. $H_2$ and Particulate Contamination | Low Temperature Insulators over Metals, Passivation - Nitride |

Low pressure chemical vapor deposition (LPCVD) in some cases is able to overcome the uniformity, step coverage, and particulate contamination limitations of early APCVD systems. By operating at medium vacuum, 0.25–2.0 torr, and higher temperatures, 550°–600° C., LPCVD reactors typically deposit films in the reaction rate limited regime. At reduced pressure the diffusivity of the reactant gas molecules is sufficiently increased so that mass-transfer to the substrate no longer limits the growth rate. The surface reaction rate is very sensitive to temperature, but precise temperature control is relatively easy to achieve. The elimination of mass-transfer constraints on reactor design allows the reactor to be optimized for high wafer capacity. Low pressure operation also decreases gas phase reactions, making LPCVD films less subject to particulate contamination. LPCVD is used for depositing many types of films, including poly-Si, $Si_3N_4$, $SiO_2$, PSG, BPSG, and W.

The two main disadvantages of LPCVD are the relatively low deposition rates, and the relatively high operating temperatures. Attempting to increase deposition rates by increasing the reactant partial pressures, tends to initiate gas phase reactions. Attempting to operate at lower temperatures, results in unacceptably slow film deposition. One of the features of the present invention is the discovery that by using selected deposition source reagents, rather than methyl-containing reagents and the like which have been traditional, greatly increased deposition rates can be accomplished without the deleterious reactions and poor results which have plagued the industry for so many years.

LPCVD reactors are designed in two primary configurations: (a) horizontal tube reactors; and (b) vertical flow isothermal reactors.

Horizontal tube, hot wall reactors are the most widely used LPCVD reactors in VLSI processing. They are employed for depositing poly-Si, silicon nitride, and undoped and doped $SiO_2$ films. They find such broad applicability primarily because of their superior economy, throughput, uniformity, and ability to accommodate large diameter, e.g. 150 mm wafers. Their main disadvantages are susceptibility to particulate contamination and low deposition rates.

The vertical flow isothermal LPCVD reactor further extends the distributed gas feed technique, so that each wafer receives an identical supply of fresh reactants. Wafers are again stacked side by side, but are placed in perforated-quartz cages. The cages are positioned beneath long, perforated, quartz reaction-gas injector tubes, one tube for each reactant gas. Gas flows vertically from the injector tubes, through the cage perforations, past the wafers, parallel to the wafer surface and into exhaust slots below the cage. The size, number, and location of cage perforations are used to control the flow of reactant gases to the wafer surfaces. By properly optimizing cage perforation design, each wafer can be supplied with identical quantities of fresh reactants from the vertically adjacent injector tubes. Thus, this design can avoid the wafer-to-wafer reactant depletion effects of the end-feed tube reactors, requires no temperature ramping, produces highly uniform depositions, and reportedly achieves low particulate contamination.

The third and last of the major CVD deposition methods is categorized not only by pressure regime, but also by its method of energy input. Rather than relying solely on thermal energy to initiate and sustain chemical reactions, plasma enhanced CVD, or PECVD uses an rf-induced glow discharge to transfer energy into the reactant gases, allowing the substrate to remain at a lower temperature than in APCVD or LPCVD processes. Lower substrate temperature is the major advantage of PECVD, and in fact, PECVD provides a method of depositing films on substrates that do not have the thermal stability to accept coating by other methods, the most important being the formation of silicon nitride and $SiO_2$ over metals. In addition, PECVD can enhance the deposition rate when compared to thermal reactions alone, and produce films of unique compositions and properties. Desirable properties such as good adhesion, low pinhole density, good step coverage, adequate electrical properties, and compatibility with fine-line pattern transfer processes, have led to application of these films in VLSI.

The plasma, also referred to as a glow discharge, which is defined as a partially ionized gas containing an equal number of positive and negative charges, as well as some other number of non-ionized gas particles is generated by the application of a radio frequency field to a low pressure gas, thereby creating free electrons within the discharge region. The electrons gain sufficient energy from the electric field so that when they collide with gas molecules, gas-phase dissociation and ionization of the reactant gases, e.g. silane and nitrogen or oxygen-containing species then occurs.

The energetic particles used to strike target materials to be sputtered in VLSI sputter deposition systems are generated by glow-discharges. A glow-discharge is a self-sustaining type of plasma.

The energetic species are then adsorbed on the film surface. The radicals tend to have high sticking coefficients, and also appear to migrate easily along the surface after adsorption. These two factors can lead to excellent film conformality. Upon being adsorbed on the substrate, they are subjected to ion and electron bombardment, rearrangements, reactions with other adsorbed species, new bond formations and film formation and growth. Adatom rearrangement includes the diffusion of the adsorbed atoms onto stable sites and concurrent desorption of reaction products. Desorption rates are dependent on substrate temperature, and higher temperatures produce films with fewer entrapped by-products. Gas-phase nucleation should be avoided to reduce particulate contamination.

The fact that the radicals formed in the plasma discharge are highly reactive presents some options, as well as some problems, to the process engineer. PECVD films, in general, are not stoichiometric because the deposition reactions are so varied and complicated. Moreover, by-products and incidental species are incorporated into the resultant films, especially hydrogen, nitrogen, and oxygen, in addition to the desired products. Excessive incorporation of these contaminants may lead to outgassing and concomitant bubbling, cracking, or peeling during later thermal cycling, and to threshold shifts in MOS circuits.

A plasma process requires control and optimization of several deposition parameters besides those of an LPCVD process, including rf power density, frequency, and duty cycle. The deposition process is dependent in a very complex and interdependent way on these parameters, as well as on the usual parameters of gas composition, flow rates, temperature, and pressure. Furthermore, as with LPCVD, the PECVD method is surface reaction limited, and adequate substrate temperature control is thus necessary to ensure film thickness uniformity.

Chemical vapor deposited (CVD) $SiO_2$ films, and their binary and ternary silicates, find wide use in VLSI processing. These materials are used as insulation between polysilicon and metal layers, between metal layers in multilevel metal systems, as getters, as diffusion sources, as diffusion and implantation masks, as capping layers to prevent outdiffusion, and as final passivation layers. In general, the deposited oxide films must exhibit uniform thickness and composition, low particulate and chemical contamination, good adhesion to the substrate, low stress to prevent cracking, good integrity for high dielectric breakdown, conformal step coverage for multilayer systems, low pinhole density, and high throughput for manufacturing.

CVD silicon dioxide is an amorphous structure of $SiO_4$ tetrahedra with an empirical formula $SiO_2$. Depending on the deposition conditions, as summarized in Table 2, CVD silicon dioxide may have lower density and slightly different stoichiometry from thermal silicon dioxide, causing changes in mechanical and electrical film properties, such as index of refraction, etch rate, stress, dielectric constant and high electric-field breakdown strength. Deposition at high temperatures, or use of a separate high temperature post-deposition anneal step, referred to as densification can make the properties of CVD films approach those of thermal oxide.

TABLE 2

| Film Type | Properties of CVD and Thermal Silicon | | | | |
|---|---|---|---|---|---|
| | Thermal | PECVD | APCVD | $SiCl_2H_2 + N_2O$ | TEOS |
| Deposition Temp. (°C.) | 800–1200 | 200 | 450 | 900 | 700 |
| Step Coverage | Conformal | Good | Poor | Conformal | Conformal |
| Stress ($\times 10^9$ dynes/cm$^2$) | 3C | 3C–3T | 3T | 3T | 1C–2T |
| Dielectric Strength ($10^6$ V/cm) | 6–10 | 8 | 10 | 10 | 3–6 |
| Etch Rate (Å/min): (100:1, $H_2O$:HF) | | 400 | 60 | 30 | 30 |

Deviation of the CVD silicon dioxide film's refractive index, n, from that of the thermal $SiO_2$ value of 1.46 is often used as an indicator of film quality. A value of n greater than 1.46 indicates a silicon rich film, while smaller values indicate a low density, porous film. CVD $SiO_2$ is deposited with or without dopants, and each type has unique properties and applications.

There are various reactions that can be used to prepare CVD $SiO_2$. The choice of reaction is dependent on the temperature requirements of the system, as well as the equipment available for the process. The deposition variables that are important for CVD $SiO_2$ include: temperature, pressure, reactant concentrations and their ratios, presence of dopant gases, system configuration, total gas flow, and wafer spacing. There are three temperature ranges in which $SiO_2$ is formed by CVD, each with its own chemical reactions and reactor configurations. There are: (1) low temperature deposition, 300°–450° C.; (2) medium temperature deposition, 650°–750° C.; and (3) high temperature deposition, ~900° C.

The low temperature deposition of SiO$_2$ utilizes a reaction of silane and oxygen to form undoped SiO$_2$ films. The depositions are carried out in APCVD reactors, primarily of the continuous belt type, in distributed feed LPCVD reactors, or in PECVD reactors. The depletion effect precludes the use of conventional LPCVD for the SiH$_4$+O$_2$ reaction. The addition of PH$_3$ to the gas flow forms P$_2$O$_5$, which is incorporated into the SiO$_2$ film to produce a phosphosilicate glass (PSG). The reactions are given by:

$$SiH_4 + O_2 \rightarrow SiO_2 + 2H_2$$

$$4PH_3 + 5O_2 \rightarrow 2P_2O_5 + 6H_2$$

The reaction between silane and excess oxygen forms SiO$_2$ by heterogeneous surface reaction. Homogeneous gas-phase nucleation also occurs, leading to small SiO$_2$ particles that form a white powder on the reaction chamber walls, and which may potentially cause particulate contamination in the deposited films.

The deposition rate increases slowly with increased temperature between 310° and 450° C. An apparent activation energy of less than 0.4 eV has been measured which is indicative of a surface adsorption or gas phase diffusion deposition process. The deposition rate can be increased at constant temperature, up to a limit by increasing the O$_2$:SiH$_4$ ratio. Continued increase in the ratio eventually results in a decrease in deposition rate, as a result of O$_2$ being adsorbed on the substrate, thus inhibiting the SiH$_4$ decomposition.

Silicon dioxide films deposited at low temperatures exhibit lower densities than thermal SiO$_2$, and have an index of refraction of ~1.44. They also exhibit substantially higher etch rates in buffered hydrofluoric acid, HF solutions that thermal SiO$_2$. Subsequent heating of such films to temperatures between 700°–1,000° C. causes densification. That is, this step causes the density of the material to increase from 2.1 g/cm$^3$ to 2.2 g/cm$^3$, the film thickness to decrease, and the etch rate in HF to decrease.

SiO$_2$ can also be deposited by a plasma enhanced reaction between SiH$_4$ and N$_2$O, nitrous oxide or O$_2$ at temperatures between 200°–400° C.

$$SiH_4 + 2N_2O \xrightarrow{200-400° C., rf} SiO_2 + 2N_2 + 2H_2$$

Nitrogen and/or hydrogen is often incorporated in PECVD SiO$_2$. A low ratio of N$_2$O/SiH$_4$ will increase the index of refraction, due to large amounts of nitrogen incorporated in the film and the formation of silicon rich films. Nearly stoichiometric, n=1.46, plasma oxide films can be achieved by reacting SiH$_4$ and O$_2$ mixtures. The buffered HF etch rate is a sensitive measure of the film's stoichiometry and density. Lower deposition temperatures and higher N$_2$O/SiH$_4$ ratios lead to less dense films and faster etch rates. As with nitride films, PECVD oxides also contain 2-10 at % H$_2$ in the form of Si—H, Si—O—H, and H—O—H. The hydrogen concentration is a strong function of the deposition parameters. Low deposition temperatures, high rf power, and high carrier-gas flow rates are required to prevent gas phase nucleation and its attendant particulate problems.

Plasma oxide films are generally deposited in compressive stress, with values ranging between 1×10$^8$–4×10$^9$ dynes/cm$^2$, depending on deposition temperature and rate. Dielectric strengths of 4–8×10$^6$ V/cm, and dielectric constants ranging from 4–5 have been obtained. Low pinhole counts have been obtained with PECVD oxides, as have very conformal coatings. Adhesion to metal is also reported to be excellent.

In the medium temperature range, SiO$_2$ is deposited in LPCVD reactors by decomposing tetraethosiloxane, Si(OC$_2$H$_5$)$_4$, also known as tetraethyl orthosilicate, or TEOS. The deposition rate for TEOS shows an exponential increase with temperature in the range of 650°–800° C. with an apparent activation energy of 1.9 eV. This pronounced temperature dependence can lead to thickness control problems. The deposition rate is also dependent on the TEOS partial pressure. It is linearly dependent at low partial pressures, and tends to level off as the adsorbed TEOS saturates the surface. TEOS films generally show excellent conformality.

At high temperatures, near 900° C., SiO$_2$ is formed by an LPCVD process in which dichlorosilane and nitrous oxide are reacted. The reaction is given by:

$$SiH_2CL_2 + 2N_2O \rightarrow SiO_2 + 2N_2 + 2HCl.$$

Such depositions produce films having excellent uniformity, and with properties close to those of thermal SiO$_2$. High-temperature LPCVD is sometimes used to deposit SiO$_2$ over poly-Si.

Many treatises, texts and a massive volume of technical journal literature describe in more detail the background of the technology in which this invention lies; see, for example, Thomas, HANDBOOK OF TRANSISTORS, SEMICONDUCTORS, INSTRUMENTS AND MICROELECTRONICS, Prentice Hall, Englewood Cliffs, N.J. 1968 and the extensive publications of the J. C. Schumacher Company, e.g. *Tetraethyl Orthosilicate (TEOS)*, Product Data Sheet No. 6; *Tetraethyl Orthosilicate for Semiconductor High Temperature Silicon Dioxide Depositions*, Product Application Note No. 8; *TEOS and Liquid Dopant Sources for CVD SiO$_2$, PSG, and BPSG*, Product Application Note No. 15; Adams and Capio, *The Deposition of Silicon Dioxide Films at Reduced Pressure*, Technical Article Reprint No. 5.

Thus, the deposition of doped and undoped silicon oxide films is an important process in semiconductor device fabrication. The decomposition process commonly utilizes toxic and pyrophoric gases. The use of safer liquid sources is the goal of many investigators. F. S. Becker and D. Pawlik, ECS 85-2 (85)380, ECS 86-8 p 148 "A New LPCVD Borophosphosilicate Glass Process Based on the Doped Deposition of TEOS-Oxide". G. Smolinsky and T. P. H. F. Wendling, JECS 132(85)950 "Measurement of the Temperature Dependent stress of Silicon Oxide Films Prepared by a Variety of CVD Methods". G. Smolinsky and R. E. Dean "LPCVD of Silicon Oxide Films in the Temperature Range of 410° to 600° C. from Diacetoxyditertiarybutoxysilane". F. S. Becker, D. Pawlik, H. Schaefer, and G. Staudigl, JVST B4(86)232 "Process and Film Characterization of Low Pressure TEOS-Borophosphosilicate Glass". D. S. Williams and E. A. Dein "LPCVD of Borophosphosilicate Glass from Organic Reactants". The thermal decomposition of tetraethoxysilane (TEOS) has been used for over twenty years to obtain undoped silicon dioxide films in the temperature range from 600° to 800° C., A. Hochberg and D. O'-Meara "LPCVD of Silicon Dioxide Films from Tetraethoxysilane".

The deposition of silicon dioxide films has been disclosed in copending U.S. patent application Ser. No. 07/036,979, filed Apr. 10, 1987, to which reference is made for further background as to the state of the art, and U.S. Pat. No. 4,168,330 to Kaganowicz also discloses the use of some siloxanes in the deposition of silicon oxides by glow discharge at low temperatures.

Alkylsilanes have also been considered as source reagents for the production of silicon dioxide films on semiconductor devices, but only in high temperature reactions typically above 800° C. in most instances. East German Patent No. 90,185 discloses the coating of silicon substrates at about 1,000° C. with silicon nitride or silicon oxide, the latter according to the reaction:

$$Si(CH_3)_4 + 2H_2O \rightarrow SiO_2 + 4CH_4;$$

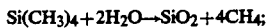

H. Fischer discloses the production of silicon oxynitride films by the APCVD process, reacting tetramethylsilane, ammonia and oxygen at 800° C. to 1,000° C., *Z. phys. Chemie.* Leipzig 252 (1973) 1, S. 213–234; and Y. Avigal, I. Beinglass and M. Schieber disclose APCVD process production of $SiO_2$ films by the oxidation of tripropylsilane vapors at 650° C., *J. Electrochem. Soc.* V. 121, N. 8, pp. 1103–7 and Israeli Patent No. 42,249. The skill and tradition of the art has been to the effect that satisfactory $SiO_2$ films could be obtained from alkoxy and alkylsilanes only at temperatures of from about 800° C. to 1,100° C., Avigal et al departing only slightly in studying the oxidation of a particular species, tripropylsilane, at about 650° C. in an APCVD process with low deposition rates, but concluded that a temperature of about 850° C. was optimum.

It has now been discovered that methylsilanes are distinctly inferior to ethyl-, propyl-, butyl-, etc., alkylsilanes in LPCVD processes and that very high quality silicon dioxide films can be deposited at hitherto unattainable deposition rates in an LPCVD process at low temperatures using 2-carbon or greater alkylsilanes.

SUMMARY OF THE INVENTION

High quality silicon dioxide films are deposited, according to this invention, at temperatures of from about 325° C. to about 500° C. using a modified Low Pressure Chemical Vapor Deposition (LPCVD) process using silanes selected from the group consisting of alkylsilane, arylsilane and aralkylsilane wherein the alkyl-, aryl- or aralkyl- moiety comprises from 2–6 carbons. The highly preferred alkylsilanes are ethyl and t-butylsilanes, ethylsilanes being more readily available and less expensive, t-butylsilane having slightly superior performance characteristics.

One of the major principles of this invention is the discovery that by using deposition source reagents described herein, rather than methyl-containing reagents and the like which have been traditional, greatly increased deposition rates can be accomplished without the deleterious reactions and poor results which have plagued the industry for a decade or more.

The process of this invention is carried out at temperatures of from about 325° C. to about 600° C., pressures of from about 0.1 torr to about 1.5 torr, typically in the 0.25 to 1 torr pressure range. At these pressures and at low temperatures surprisingly high deposition rates of as high as 400 to 500 angstroms/minute are accomplished by the oxidation of alkylsilanes of the general formula

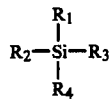

wherein: $R_1$, $R_2$, $R_3$ and $R_4$ are hydrogen, C-2 to C-6 alkyl, aryl or aralkyl groups, at least one of $R_1$, $R_2$, $R_3$ and $R_4$, being alkyl, aryl or aralkyl.

The most highly preferred of the alkylsilanes, from a purely technical perspective, is t-butylsilane. However, at the present time, the alkylsilane considered to be most important industrially is diethylsilane because it is available at relatively low cost in high purity industrial quantities, and deposits excellent SiO2 films at high rates.

It will be understood that $R_1$, $R_2$, $R_3$ and $R_4$ may be different 2–4 carbon containing alkyl groups, such as, for example, ethylpropyl-t-butylsilane, diethyl-di-t-butylsilane, ethylpropylazidosilane, etc. Generally speaking, however, the synthesis of such compounds is more complex and it would be more expensive to obtain such compounds in high purity industrial quantities.

The prior art has disclosed the use of the class of compounds under consideration here in CVD processes, but never as low temperature processes; indeed, the inference to be drawn from the prior art generally is to the effect that high temperatures and/or plasma activation is necessary. For example, Israel Patent No. IL-42,249 discloses the use of tetramethylsilane, tetraethylsilane, tripropylsilane and diethylsilane in a chemical vapor deposition process carried out at from 750° C. to 850° C. using oxygen as the oxidant and carrier gas in an Atmospheric Pressure Chemical Vapor Deposition process (APCVD) process, which is distinctly different than the present process. A different but somewhat related APCVD process is disclosed in East German Patent No. 90,185 wherein tetrmethylsilane is reacted with $O_2$, $H_2O$, $NH_3$ or $CO_2$ at about 1,000° C. using $H_2$ as the carrier gas. The latter process is also reported with the specific example of the production of $SiO_2$ films by the oxidation of tripropylsilane vapors at 650° C. by Avigal, et al, *J. Electrochem. Soc.* V. 121, N. 8, pp. 1103–7.

The present invention differs from the above mentioned and other prior art in a number of important points which will be illustrated by the examples and parameters provided hereinafter.

First of all, the present invention is an LPCVD process, as distinct from an APCVD process. This, alone, introduces an entirely new set of reactions, and reaction conditions.

Secondly, while the prior art generally has considered alkylsilanes as a homologous series there is, as discovered and reported herein, no homology vis-a-vis the process conditions described herein; indeed, there is a step-function between methylsilanes and ethylsilanes which is not understood but which is as clear as it is surprising. According to the present invention, it has been discovered that methylsilanes, under the LPCVD process conditions described here, react and give results very dramatically different from the $C_2$–$C_4$ compounds which are preferred in this invention; indeed, the presence of methylsilane in significant quantities results in lower deposition rates and poor film quality. Thus, the compositions suitable for the process of this invention are referred to as consisting essentially of $C_2$–$C_6$ alkylsilanes, the $C_2$–$C_4$ alkylsilanes being greatly preferred. While small amounts of methylsilanes can probably be tolerated, much as impurities to a limited degree can be tolerated in most processes, the process of this invention cannot be carried out with methylsilanes.

One of the great distinctions and advantages of the present invention over processes using methylsilanes is that the deposition rate is, typically, some 50 to 60 times the rate of deposition using methylsilane under comparable conditions, and vastly superior $SiO_2$ films result.

These and other advantages will appear from the description of the preferred embodiments.

DESCRIPTION OF THE PREFERRED EMBODIMENT

The process of this invention is carried out using the well established LPCVD technology, modified by the process conditions mentioned above and discussed hereinafter. The purpose of the discussion and examples is to disclose the preferred embodiment in such terms as will enable the art to practice the invention, and not as a limitation upon the scope of the invention.

The process of the present invention is carried out under LPCVD process conditions, varied as described, with a silicon-containing feed consisting essentially of compounds having the general formula

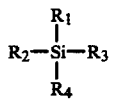

wherein: $R_1$, $R_2$, $R_3$ and $R_4$ are hydrogen, C-2 to C-6 alkyl, aryl or aralkyl groups, at least one of $R_1$, $R_2$, $R_3$ and $R_4$, being alkyl, aryl or aralkyl. As summarized above, the most highly preferred of the alkylsilanes, from a purely technical perspective, is t-butylsilane. However, at the present time, the alkylsilane considered to be most important industrially is diethylsilane because it is available at relatively low cost in high purity industrial quantities, and deposits excellent SiO2 films at high rates.

The process of this invention is carried out in a vacuum in the general range of from about 0.1 to about 1.5 mtorr, usually from about 0.5 torr to 1.0 torr, and, most efficiently with best results, in a pressure range of from about 0.5 to 1 torr, and in a temperature range of from about 325° C. to about 550° C., generally, with operation up to about 600° C. or even higher in certain instances, e.g. using tetraethylsilane and other tetra-substituted silanes where the temperature may be optimum in the range of about 700° C. plus or minus perhaps 50° C., the optimum temperature range being a function of the silicon feed stock composition, but generally from above 325° C. to 500° C. using the preferred feedstocks.

$SiO_2$ films are produced in an oxygen containing vacuum atmosphere. Such films can be obtained using carbon dioxide, but are more efficiently formed in better quality using oxygen as the oxidizing reagent. Oxygen flow rates are not critical; however, it has been found that the $O_2$:Si feed stock ratio is optimally lower than in known processes. Oxygen flow is optimized based upon a particular Si-source feed rate empirically at a pressure in the desired range, typically 0.5 torr, to maximize $SiO_2$. As pointed out below, the oxygen, or carbon dioxide, flow rate varies with temperature on a volume:volume ratio with the alkylsilane from about a 1:1 volume ratio at low temperatures to 6:1 volume ratio, or higher, at temperatures near the high end of the operating range.

A typical reaction is carried out in a 150 mm hot-wall LPCVD horizontal tube reactor, though the apparatus configuration is not critical, using, in the examples, 100 mm Si wafers, with an $R_1,R_2,R_3,R_4$-Si feed rate of from about 0.05 to 2 gm/min, typically about 0.5 gm/min with $O_2$ flow to provide an optimum deposition rate and film quality, and is adjusted on a vol:vol ratio with respect to the si-containing feed, and is a function of temperature.

The following examples illustrate, but do not limit, the concept or scope of the invention.

EXAMPLE 1, DIETHYLSILANE - $SiO_2$

The process as described was carried out using diethylsilane as the Si-containing feed stock at a rate of 0.5 gm/min at the temperatures specified for the individual runs, and with the results indicated.

| Run No. | Temperature (Deg. C.) | SiO2 Deposition Rate (Angstroms/Min) |
| --- | --- | --- |
| 1.1 | 350 | 30 |
| 1.2 | 380 | 50 |
| 1.3 | 550 | 210 |

EXAMPLE 2, TRIETHYLSILANE - $SiO_2$

The process as described was carried out using triethylsilane as the Si-containing feed stock at a rate of 0.5 gm/min at the temperatures specified for the individual runs, and with the results indicated.

| Run No. | Temperature (Deg. C.) | SiO2 Deposition Rate (Angstroms/Min) |
| --- | --- | --- |
| 2.1 | 500 | 4 |
| 2.2 | 550 | 100 |
| 2.3 | 600 | 270 |

EXAMPLE 3, TETRAETHYLSILANE - $SiO_2$

The process as described was carried out using tetraethylsilane as the Si-containing feed stock at a rate of 0.5 gm/min at the temperatures specified for the individual runs, and with the results indicated.

| Run No. | Temperature (Deg. C.) | SiO2 Deposition Rate (Angstroms/Min) |
| --- | --- | --- |
| 3.1 | 600 | 25 |
| 3.2 | 700 | 270 |

Among the advantages of the present invention is the safety attendant with the use of the reagents described. These reagents are liquid and more easily and safely handled than silane, the conventional reagent of the prior art, are less toxic and minimize explosion and fire hazards.

As pointed out before, the deposition rates attainable are surprisingly high, 50 to 60 times as high in some cases, as compared with alkoxysilanes, and it is possible to prepare excellent films even at low temperatures and high deposition rates. It has been discovered that the degradation of surface characteristics of aluminum surface substrates which is experienced at higher temperatures is avoided using the present invention.

Where desirable, it is, of course, possible to add a dopant to the film, simply by adding the dopant vapor in the LPCVD chamber during deposition.

INDUSTRIAL APPLICATION

The greatest industrial application of this invention is in the manufacture of semiconductor devices; however, the discoveries of this invention are applicable to any thin film deposition of $SiO_2$ on substrates which are capable of being heated to temperatures in the range of from about 300° C. to about 700° C.

What is claimed is:

1. A low temperature chemical vapor deposition process comprising the steps of:
   heating a substrate upon which deposition is desired to a temperature of from about 325° C. to about 700° C. in a vacuum having a pressure of from about 0.1 to about 1.5 torr, and maintaining such pressure during the process;
   introducing into the vacuum a silicon-containing feed and an oxygen containing feed, said silicon containing feed consisting essentially of one or more compounds having the general formula

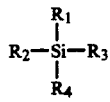

wherein: $R_1$, $R_2$, $R_3$ and $R_4$ are hydrogen, or C-2 to C-6 alkyl, aryl or aralkyl groups, at least one of $R_1$, $R_2$, $R_3$ and $R_4$, being C-2 to C-6 alkyl, aryl or aralkyl;
   maintaining the temperature and pressure in said ranges thereby causing a film of silicon dioxide to deposit on said substrate.

2. The process of claim 1 wherein the silicon containing feed consists essentially of an alkyl silane and wherein oxygen is introduced as the oxygen containing feed to form a layer of silicon dioxide on the substrate.

3. The process of claim 2 wherein the silicon containing feed consists essentially of diethylsilane or t-butylsilane.

4. The process of claim 2 wherein the silicon containing feed consists essentially of triethylsilane and the temperature is from about 450° C. to about 700° C.

5. The process of claim 2 wherein the silicon containing feed consists essentially of tetraethylsilane and the temperature is from about 500° C. to about 700° C.

6. A chemical vapor deposition process comprising the steps of:
   heating a substrate upon which deposition is desired to a temperature of from about 325° C. to about 700° C. in a vacuum having a pressure of from about 0.1 to about 1.5 torr, and maintaining such pressure during the process;
   introducing a silane selected from the group consisting of alkylsilane, arylsilane and aralkylsilane wherein the alkyl-, moiety comprises from 2-6 carbons and oxygen or carbon dioxide into the vacuum; and
   maintaining the temperature and pressure in said ranges thereby causing a film of silicon dioxide having a refractive index of about 1.46 to deposit on said substrate.

7. The process of claim 6 wherein the silane is diethylsilane and the temperature is from about 325° C. to about 500° C.

8. The process of claim 6 wherein the silane is t-butylsilane and the temperature is from about 325° C. to about 500° C.

9. The process of claim 6 wherein the silicon containing feed consists essentially of triethylsilane and the temperature is from about 450° C. to about 700° C.

10. The process of claim 6 wherein the silicon containing feed consists essentially of tetraethylsilane and the temperature is from about 500° C. to about 700° C.

* * * * *